(12) United States Patent
Shin

(10) Patent No.: US 10,808,916 B2
(45) Date of Patent: Oct. 20, 2020

(54) LIGHTING DEVICE INCLUDING AN IMAGING UNIT HAVING INCLINED OPTICAL AXIS WITH RESPECT TO HORIZONTAL LINE

(71) Applicant: SL Corporation, Daegu (KR)

(72) Inventor: Ki Hae Shin, Gyeongsan-si (KR)

(73) Assignee: SL Corporation, Daegu (KR)

( * ) Notice: Subject to any disclaimer, the term of this patent is extended or adjusted under 35 U.S.C. 154(b) by 0 days.

(21) Appl. No.: 16/440,595

(22) Filed: Jun. 13, 2019

(65) Prior Publication Data

US 2020/0088385 A1    Mar. 19, 2020

(30) Foreign Application Priority Data

Sep. 14, 2018   (KR) ........................ 10-2018-0110384

(51) Int. Cl.
| | |
|---|---|
| F21V 13/04 | (2006.01) |
| F21S 41/143 | (2018.01) |
| F21V 5/04 | (2006.01) |
| F21V 7/10 | (2006.01) |
| G02B 26/08 | (2006.01) |

(52) U.S. Cl.
CPC ............ *F21V 13/04* (2013.01); *F21S 41/143* (2018.01); *F21V 5/04* (2013.01); *F21V 7/10* (2013.01); *G02B 26/08* (2013.01); *H05K 2201/10106* (2013.01)

(58) Field of Classification Search
CPC .... F21V 13/04; F21V 7/10; F21V 5/04; F21S 41/143; G02B 26/08
See application file for complete search history.

(56) References Cited

U.S. PATENT DOCUMENTS

2016/0247291 A1*   8/2016   Otsu ..................... G02F 1/1313

* cited by examiner

Primary Examiner — Joseph L Williams
(74) Attorney, Agent, or Firm — Nelson Mullins Riley & Scarborough LLP; Kongsik Kim, Esq.

(57) ABSTRACT

Provided is a lighting device, and more particularly, a lighting device that prevents deterioration of light efficiency and reduces overall size. The lighting device includes a light source unit, an imaging unit which transmits incident light to form a predetermined optical pattern, a mirror unit which is disposed behind the imaging unit and reflects light to the imaging unit, and a light control unit which reflects light generated from the light source unit to the mirror unit at a predetermined angle and pattern, wherein the imaging unit includes a plurality of lenses having the same optical axis and arranged along the optical axis.

16 Claims, 7 Drawing Sheets

LIGHTING DEVICE INCLUDING AN IMAGING UNIT HAVING INCLINED OPTICAL AXIS WITH RESPECT TO HORIZONTAL LINE

CROSS REFERENCE TO RELATED APPLICATION

This application claims the benefit of Korean Patent Application No. 10-2018-0110384, filed on Sep. 14, 2018, the disclosure of which is incorporated herein by reference in its entirety.

BACKGROUND

1. Technical Field

The present disclosure relates to a lighting device, and more particularly, to a lighting device that prevents deterioration of light efficiency and reduces overall size.

2. Description of the Related Art

A vehicle generally includes lighting devices to enable the driver of the vehicle to more easily detect objects around the vehicle while driving in low light conditions (e.g., night) or to inform other vehicles or pedestrians of the vehicle's driving state.

Recently, a technology for enabling easier light control by using a digital micromirror device (DMD) in a lighting device is being utilized. The DMD controls each of a plurality of micromirrors so that incident light becomes effective light to be incident on an imaging system or ineffective light not to be incident on the imaging system.

A lighting device that uses the DMD may include various optical elements such as a lens, a prism and a reflector for transmitting light generated from a light source to the DMD. To prevent the optical or structural interference between the DMD and the optical elements, the DMD and the optical elements need to be spaced apart from each other by predetermined distances. Thus, there is a limitation in reducing the overall size of the lighting device.

In this regard, there is a need for a method of preventing the deterioration of light efficiency and reducing the overall size of a lighting device in which the DMD is used.

SUMMARY

Aspects of the present disclosure provide a lighting device that prevents deterioration of light efficiency and reduces overall size by disposing a mirror unit, which reflects light to an imaging unit, at a particular position with respect to the imaging unit.

However, aspects of the present disclosure are not restricted to the one set forth herein.

The above and other aspects of the present disclosure will become more apparent to one of ordinary skill in the art to which the present disclosure pertains by referencing the detailed description of the present disclosure given below.

According to an aspect of the present disclosure, a lighting device may include a light source unit, an imaging unit which transmits incident light to form a predetermined optical pattern, a mirror unit which is disposed behind the imaging unit and reflects light to the imaging unit, and a light control unit which reflects light generated from the light source unit to the mirror unit at a predetermined angle and pattern, wherein the imaging unit includes a plurality of lenses having the same optical axis and arranged along the optical axis.

The lighting device according to exemplary embodiments of the present disclosure may include one or more of the following features in any feasible combination. In the lighting device, a center of the mirror unit may be disposed above or below a horizontal line that passes through a center of an incident portion of the imaging unit. The center of the incident portion may be a center of an incident surface of a lens disposed closest to the mirror unit among the plurality of lenses. The optical axis of the imaging unit may be inclined at a predetermined angle with respect to the horizontal line. The optical axis of the imaging unit may be inclined upward or downward from the horizontal line toward the front. A centerline of an irradiation range of light reflected by the mirror unit may be inclined at a predetermined angle with respect to the horizontal line. The centerline of the irradiation range of the light reflected by the mirror unit may coincide with the optical axis of the imaging unit. The centerline of the irradiation range of the light reflected by the mirror unit may be inclined upward or downward from the horizontal line toward the front. Additionally or alternatively, a line that perpendicularly passes through a reflecting surface of the mirror unit may be disposed parallel to the horizontal line. Alternatively, the line that perpendicularly passes through the reflecting surface of the mirror unit may be inclined at a predetermined angle with respect to the horizontal line.

Further, the light source unit may be disposed on one of an upper side and a lower side with respect to a path of light reflected by the mirror unit, and the light control unit may be disposed on the other of the upper side and the lower side. Alternatively, the light source unit and the light control unit may be disposed on the same side with respect to a path of light reflected by the mirror unit. The light source unit may include a reflector which reflects light generated from a light source to the light control unit, and the mirror unit and the imaging unit may be disposed between the reflector and the light control unit to allow light reflected by the mirror unit to be incident on the imaging unit. The optical axis of the plurality of lenses may pass above or below the center of the mirror unit. The mirror unit may include a plurality of micromirrors and actuators to adjust an angle of each of the plurality of micromirrors.

BRIEF DESCRIPTION OF THE DRAWINGS

These and/or other aspects of the present disclosure will become more apparent and more readily appreciated from the following description of the exemplary embodiments, taken in conjunction with the accompanying drawings in which.

DETAILED DESCRIPTION

Figure 1:
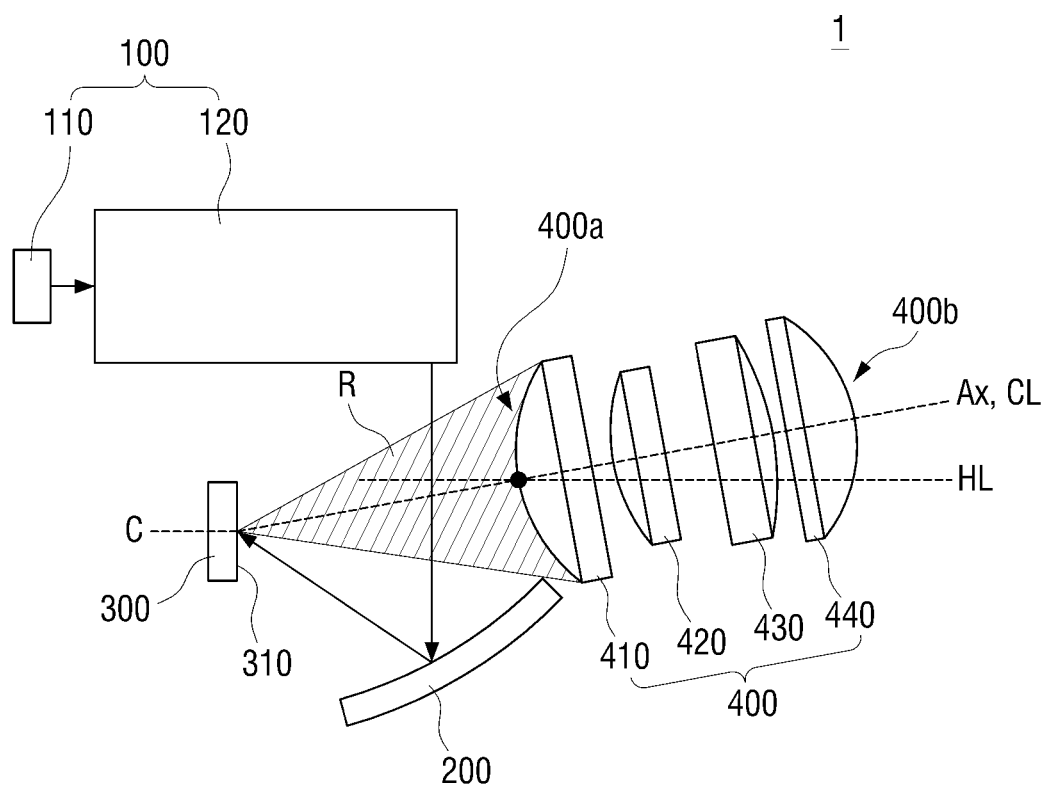
FIG. 1 is a schematic diagram of a lighting device according to an exemplary embodiment of the present disclosure.

Advantages and features of the present disclosure and methods of accomplishing the same may be understood more readily by reference to the following detailed description of exemplary embodiments and the accompanying drawings. The present disclosure may, however, be embodied in many different forms and should not be construed as being limited to the exemplary embodiments set forth herein. Rather, these exemplary embodiments are provided so that this disclosure will be thorough and complete and will fully convey the concept of the disclosure to those skilled in the art, and the present disclosure will only be defined by the appended claims. Like reference numerals refer to like elements throughout the specification.

Therefore, in some exemplary embodiments, well-known processes, well-known structures and well-known technologies will not be specifically described in order to avoid ambiguous interpretation of the present disclosure.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, and/or operations, but do not preclude the presence or addition of one or more other components, steps, operations, and/or groups thereof. As used herein, the term "and/or" includes any and all combinations of one or more of the associated listed items.

Exemplary embodiments of the disclosure are described herein with reference to perspective, cross-section, side and/or schematic illustrations that are illustrations of exemplary embodiments of the disclosure. As such, variations from the shapes of the illustrations as a result, for example, of manufacturing techniques and/or tolerances, are to be expected. Thus, exemplary embodiments of the disclosure should not be construed as limited to the particular shapes of regions illustrated herein but are to include deviations in shapes that result, for example, from manufacturing. In addition, each component illustrated in figures of the present disclosure may have been enlarged or reduced for ease of description.

Hereinafter, the present disclosure will be described with reference to the drawings for explaining lighting devices according to exemplary embodiments of the present disclosure. FIG. 1 is a schematic diagram of a lighting device 1 according to an exemplary embodiment of the present disclosure. Referring to FIG. 1, the lighting device 1 according to the exemplary embodiment of the present disclosure may include a light source unit 100, a light control unit 200, a mirror unit 300, and an imaging unit 400.

The lighting device 1 of the present disclosure may be a device that is capable of being used in vehicles, drones, trains, or the like that need to secure visibility at night or in dark conditions. In the exemplary embodiment of the present disclosure, the lighting device 1 may be installed in a vehicle to secure the driver's view or to inform other vehicles or pedestrians of the driving state of the vehicle. However, the lighting device 1 of the present disclosure may be used not only in vehicles, drones and trains, but also in various situations where visibility needs to be secured. When the lighting device 1 of the present disclosure is installed in a vehicle, it may be used as various types of lamps installed in a vehicle, such as a headlamp, a daytime running lamp, a fog lamp, a position lamp, a turn signal lamp, a tail lamp, a brake lamp and a backup lamp.

The light source unit 110 may include a light source 110 and a light transmitting unit 120. At least one light source 110 may generate light of an amount and/or a color suitable for the use of the lighting device 1 of the present disclosure. In the exemplary embodiment of the present disclosure, a semiconductor light emitting element such as a light emitting diode (LED) may be used as the light source 110. However, the type of the light source 110 is not limited thereto, and various types of light sources including laser diodes (LD) and bulbs as well as LEDs may also be used as the light source 110.

The light transmitting unit 120 may transmit the light generated from the light source 110 to the light control unit 200. The light transmitting unit 120 may allow the light generated from the light source 110 to be transmitted to the light control unit 200 while having optical characteristics such as brightness and irradiation area suitable for the use of the lighting device 1 of the present disclosure. In the exemplary embodiment of the present disclosure, the light transmitting unit 120 may be formed as a lens, a reflector, a prism or a combination thereof.

However, the type of the light transmitting unit 120 is not limited thereto, and the light transmitting unit 120 may include various types of optical elements depending on the optical characteristics required in the lighting device 1 of the present disclosure. The light control unit 200 may control the path of light generated from the light source unit 100 by reflecting or refracting the light at a predetermined angle or pattern, to allow the light generated from the light source unit 100 to travel (e.g., to be transmitted) to the mirror unit 300. When the light control unit 200 reflects or refracts light at the predetermined angle or pattern, it can be understood that the light control unit 200 reflects or refracts the light generated from the light source unit 100 to allow the light to selectively reach a reflecting surface 310 of the mirror unit 300 or uniformly reach the entire reflecting surface 310 of the mirror unit 300.

In the exemplary embodiment of the present disclosure, the light control unit 200 may be disposed opposite the light source unit 100 with respect to a path of the light reflected by the mirror unit 300, and may be spaced apart from the light source unit 100 by a predetermined distance. This configuration may secure a space in which the light reflected by the mirror unit 300 may enter the imaging unit 400 while preventing the light reflected by the mirror unit 300 from being interfered by the light source unit 100 and/or the light control unit 200.

In the exemplary embodiment of the present disclosure, the light source unit 100 may be disposed on an upper side of the mirror unit 300 and the light control unit 200 may be disposed on a lower side of the mirror unit 300. However, the arrangement of the light source unit 100, the light control unit 200, and the mirror unit 300 is not limited thereto, and the light source unit 100 and the light control unit 200 may also be disposed on any sides of the mirror unit 300. For example, the light source unit 100 and the light control unit 200 may be disposed on opposite sides of the mirror unit 300, and the light source unit 100 and the light control unit 200 may also be disposed on the same side of the mirror unit 300.

In the exemplary embodiment of the present disclosure, when the light source unit 100 and the light control unit 200 are disposed on the upper and lower sides of the mirror unit 300, respectively, an entirety of the light source unit 100 and an entirety of the light control unit 200 may be disposed on the upper and lower sides of the mirror unit 300, respectively. Alternatively, a part of the light source unit 100 and a part of the light control unit 200 may be disposed on the upper and lower sides of the mirror unit 300, respectively.

In addition, the light control unit 200 may be disposed in front of the mirror unit 300 to control the light generated from the light source unit 100 to be transmitted to the mirror unit 300 disposed behind the light control unit 200. This configuration may control the light reflected by the mirror unit 300 to be transmitted to the imaging unit 400 disposed in front of the mirror unit 300.

In the exemplary embodiment of the present disclosure, a reflector may be used as the light control unit 200. However, this is merely an example to help understand the present disclosure. The light control unit 200 is not limited to a reflector, and may also include various types of optical elements such as a lens and a prism capable of reflecting or refracting the light generated from the light source unit 100 to the mirror unit 300. Further, the light control unit 200 may include a single reflector in the exemplary embodiment of the present disclosure, and the light control unit 200 may also include a plurality of reflectors. In this case, the light generated from the light source unit 100 may be reflected or refracted by each of the reflectors to the mirror unit 300.

The mirror unit 300 may reflect light, which is reflected or refracted by the light control unit 200, in a forward direction to allow the light reflected or refracted by the light control unit 200 to be transmitted through the imaging unit 400. The mirror unit 300 may be be understood as serving as a light source from the perspective of the imaging unit 400.

Figure 2:
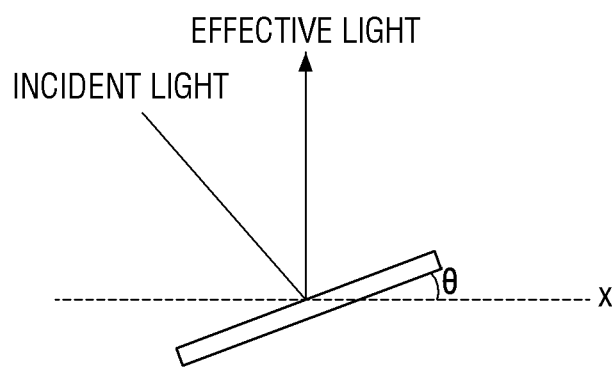
FIG. 2 is a schematic diagram of a micromirror that causes incident light to become effective light according to an exemplary embodiment of the present disclosure.
Figure 3:
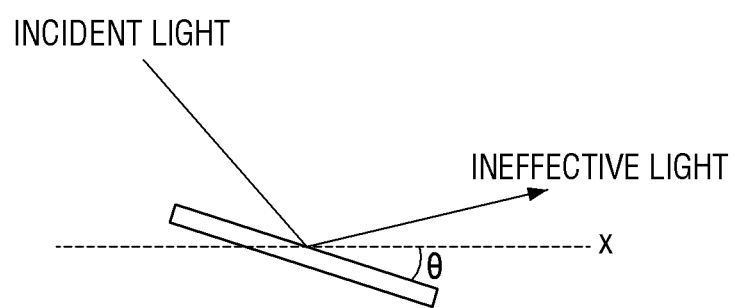
FIG. 3 is a schematic diagram of a micromirror that causes incident light to become ineffective light according to an exemplary embodiment of the present disclosure.

In the exemplary embodiment of the present disclosure, the mirror unit 300 may include a plurality of micromirrors disposed on the reflecting surface 310 for reflecting light and may control light reflected by each of the micromirrors to allow light suitable for the use of the lighting device 1 to be irradiated. Each of the micromirrors may include an ultrasmall mirror approximately 7 to 10 μm in size, and a position thereof may be adjusted by an actuator (not illustrated) as illustrated in FIGS. 2 and 3 to reflect the light generated from the light source unit 100 in any one of a plurality of directions. For example, when a micromirror is rotated in a direction from an x axis by an angle of 0°, the micromirror may reflect the incident light to allow the incident light to become effective light that is incident to the imaging unit 400. Conversely, when the micromirror is rotated in the other direction from the x axis by an angle of 0°, the micromirror may reflect the incident light to allow the incident light to become ineffective light that is not incident to the imaging unit 400. Accordingly, the mirror unit 300 may control the state of each of the micromirrors, thus enabling easier light control than when the mirror unit 300 includes a single mirror.

The mirror unit 300 may be disposed to allow a center C of the reflecting surface 310 for reflecting light to be present above or below a horizontal line HL that passes through a center of an incident portion 400a of the imaging unit 400. This configuration may prevent the structural interference between the light source unit 100, the light control unit 200 and the imaging unit 400 and may reduce the overall size of the lighting device 1 of the present disclosure by reducing a distance between the mirror unit 300 and the imaging unit 400, thus enabling miniaturization. This will be described in detail later. In some implementations, the horizontal line HL may be defined as a line that is parallel to the light generated by the light source 110 and/or perpendicular to the light that is transmitted from the light transmitting unit 120 (i.e., the light that is transmitted from the light source unit 100). However, the relationship between the horizontal line HL and the light generated from the light source unit 100 is not limited thereto.

The imaging unit 400 may include a plurality of lenses 410, 420, 430, and 440 which transmit the light reflected by the mirror unit 300. To obtain an optical pattern suitable for the use of the lighting device 1 of the present disclosure, the number of the lenses 410, 420, 430, and 440 and the curvature or size (diameter) of each of the lenses 410, 420, 430, and 440 may be variously changed.

The imaging unit 400 may include the incident portion 400a on which light is incident and an exit portion 400b from which light exits. The incident portion 400a may be understood as an incident surface of the lens 410 disposed at a rearmost position in a direction in which the light is transmitted through the imaging unit 400, and the exit portion 400b may be understood as an exit surface of the lens 440 disposed at a foremost position in the direction in which the light is transmitted through the imaging unit 400. Herein, when the light is transmitted through the imaging unit 400 in a direction from the rear to the front, the direction may be based on the assumption that the light from the lighting device 1 of the present disclosure is irradiated forward. The actual directions indicated by the rear and the front in the description of the installation position or installation direction of the lighting device 1 of the present disclosure may be different.

In the exemplary embodiment of the present disclosure, the lenses 410, 420, 430, and 440 will hereinafter be referred to as a first lens 410, a second lens 420, a third lens 430 and a fourth lens 440 from the rear in the direction in which the light is transmitted through the imaging unit 400. An optical axis Ax of the imaging unit 400 may be inclined at a predetermined angle with respect to the horizontal line HL that passes through the center of the incident portion 400a of the imaging unit 400. This may be derived from that the center C of the reflecting surface 310 of the mirror unit 300 is disposed above or below the horizontal line HL and a centerline CL of an irradiation range R of light reflected by the mirror unit 300 is inclined at a predetermined angle with respect to the horizontal line HL that passes through the center of the incident portion 400a of the imaging unit 400. The predetermined angle may be greater than 0° and less than 90°. In some implementations, the predetermined angle may be greater than 2° and less than 70°. In some implementations, the predetermined angle may be greater than 5° and less than 65°. However, the predetermined angle between the horizontal line HL and the centerline CL of the irradiation range R of the light reflected by the mirror unit 300 is not limited thereto, and the predetermined angle may be varied depending on physical and/or optical properties of each component.

In the exemplary embodiment of the present disclosure, the mirror unit 300 may be disposed below the horizontal line HL that passes through the center of the incident portion 400a of the imaging unit 400. In this case, to prevent deterioration of light efficiency that may occur when at least part of light reflected by the mirror unit 300 is blocked by the light control unit 200 disposed in front of the mirror unit 300, the centerline CL of the irradiation range R of the light reflected by the mirror unit 300 may be inclined upward from the horizontal line HL, which passes through the center of the incident portion 400a of the imaging unit 400, toward the front, and the optical axis Ax of the imaging unit 400 may also be inclined upward from the horizontal line HL, which passes through the center of the incident portion 400a of the imaging unit 400, toward the front.

In the exemplary embodiment of the present disclosure, the mirror unit 300 may be moved downward to allow the centerline CL of the irradiation range R of the light reflected by the mirror unit 300 and the optical axis Ax of the imaging unit 400 to be inclined upward from the horizontal line HL toward the front. However, when the mirror unit 300 is moved upward, the centerline CL of the irradiation range R of the light reflected by the mirror unit 300 and the optical axis Ax of the imaging unit 400 may also be inclined downward from the horizontal line HL toward the front. In other words, an angle formed by the optical axis Ax of the imaging unit 400 and the horizontal line HL may vary based on an angle formed by the centerline CL of the irradiation range R of the light reflected by the mirror unit 300 and the horizontal line HL.

Figure 4:
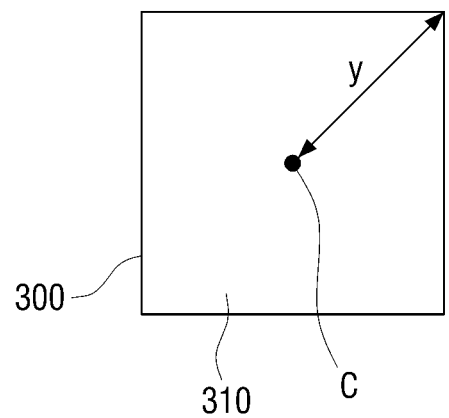
FIG. 4 is a schematic diagram of a mirror unit according to an exemplary embodiment of the present disclosure.
Figure 5:
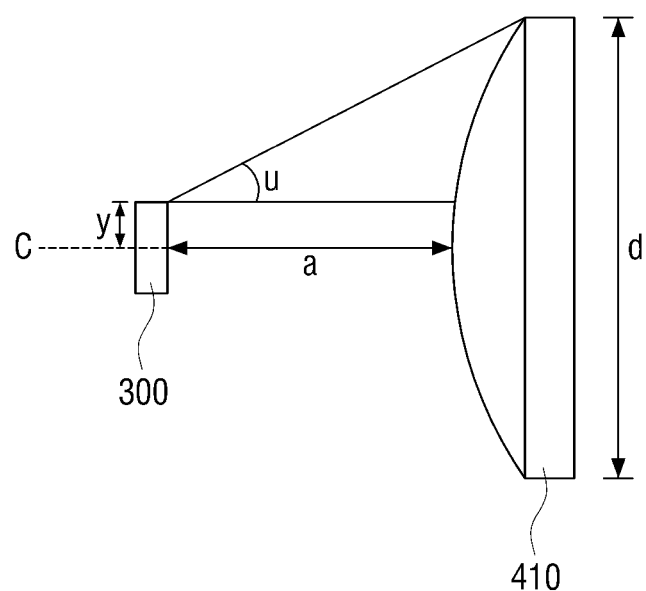
FIG. 5 is a schematic diagram illustrating the relationship between a distance between the mirror unit and an imaging unit and a diameter of a lens according to an exemplary embodiment of the present disclosure.

A diameter of the first lens 410 disposed at the rearmost position among the lenses 410, 420, 430, and 440 of the imaging unit 400 may be determined based on a size (e.g., dimension) y of the mirror unit 300 that serves as a light source from the perspective of the imaging unit 400 and a minimum distance a between the mirror unit 300 and the first lens 410, as illustrated in FIGS. 4 and 5. The minimum distance a between the mirror unit 300 and the first lens 410 may be determined based on an irradiation angle u of light reflected by the mirror unit 300.

In particular, the size y of the mirror unit 300 may be defined as a length of a longest line, i.e., a diagonal line among the lines that pass through the center C of the reflecting surface 310 of the mirror unit 300 and connect two facing points on edges of the mirror unit 300, as illustrated in FIG. 4. In the exemplary embodiment of the present disclosure, the size y of the mirror unit 300 may be defined by half the length of the diagonal line.

When the centerline CL of the irradiation range R of the light reflected by the mirror unit 300 coincides with the optical axis Ax of the imaging unit 400, the diameter of the first lens 410 disposed closest to the mirror unit 300 may be given by Equation 1 below.

$$d = 2 \times (y + a \times \tan(u)), \quad (1)$$

where d indicates the diameter of the first lens 410, y indicates half the length of the diagonal line that passes through the center C of the reflecting surface 310 of the mirror unit 300, a indicates the minimum distance between the mirror unit 300 and the first lens 410, and u indicates a half of the irradiation angle of the light reflected by the mirror unit 300. Here, y and u can be obtained based on the mirror unit 300 or through experiments.

Referring to Equation 1, it can be seen that the smaller the distance between the mirror unit 300 and the first lens 410 becomes, the smaller the diameter of the first lens 410 may become. In the exemplary embodiment of the present disclosure, since the centerline CL of the irradiation range R of the light reflected by the mirror unit 300 is inclined upward from the horizontal line HL toward the front, the light may be prevented from being blocked by the light control unit 200, thereby preventing deterioration of light efficiency. In addition, since the first lens 410 is disposed adjacent to an upper end of the light control unit 200, the distance between the mirror unit 300 and the first lens 410 may be reduced as compared with when the first lens 410 is disposed in front of the light control unit 200. Accordingly, the diameter of the first lens 410 may be reduced, thus reducing the overall size of the imaging unit 400.

When the optical axis Ax of the imaging unit 400 is inclined at a predetermined angle with respect to the horizontal line HL, it can be understood that the first lens 410 is also inclined at a predetermined angle to the horizontal line HL. In this case, a length of the first lens 410 in a vertical direction is relatively shorter as compared with when the optical axis Ax of the imaging unit 400 is parallel to the horizontal line HL. This alleviates spatial constraints imposed by the light source unit 100 and the light control unit 200, thus enabling the first lens 410 to move further rearward toward where the mirror unit 300 is disposed. Accordingly, the distance between the mirror unit 300 and the first lens 410 may be reduced.

In addition, while it is difficult to position the first lens 410 between the light source unit 100 and the light control unit 200 due to the length of the first lens 410 in the vertical direction when the optical axis Ax of the first lens 410 is disposed parallel to the horizontal line HL, the first lens 410 may be moved by cutting portions of the light source unit 100 and the light control unit 200 which are adjacent to the first lens 410 when the first lens 410 is inclined at the predetermined angle to the horizontal line HL. Therefore, the distance between the mirror unit 300 and the first lens 410 may be reduced more easily.

To this end, in the exemplary embodiment of the present disclosure, the center C of the mirror unit 300 may be disposed below the horizontal line HL that passes through the center of the incident portion 400a of the imaging unit 400, and the travelling direction of light reflected to the mirror unit 400 by the light control unit 200 may be adjusted to allow the centerline CL of the irradiation range R of the light reflected by the mirror unit 300 to be inclined upward from the horizontal line HL, which passes through the center of the incident portion 400a of the imaging unit 400, toward the front.

Figure 6:
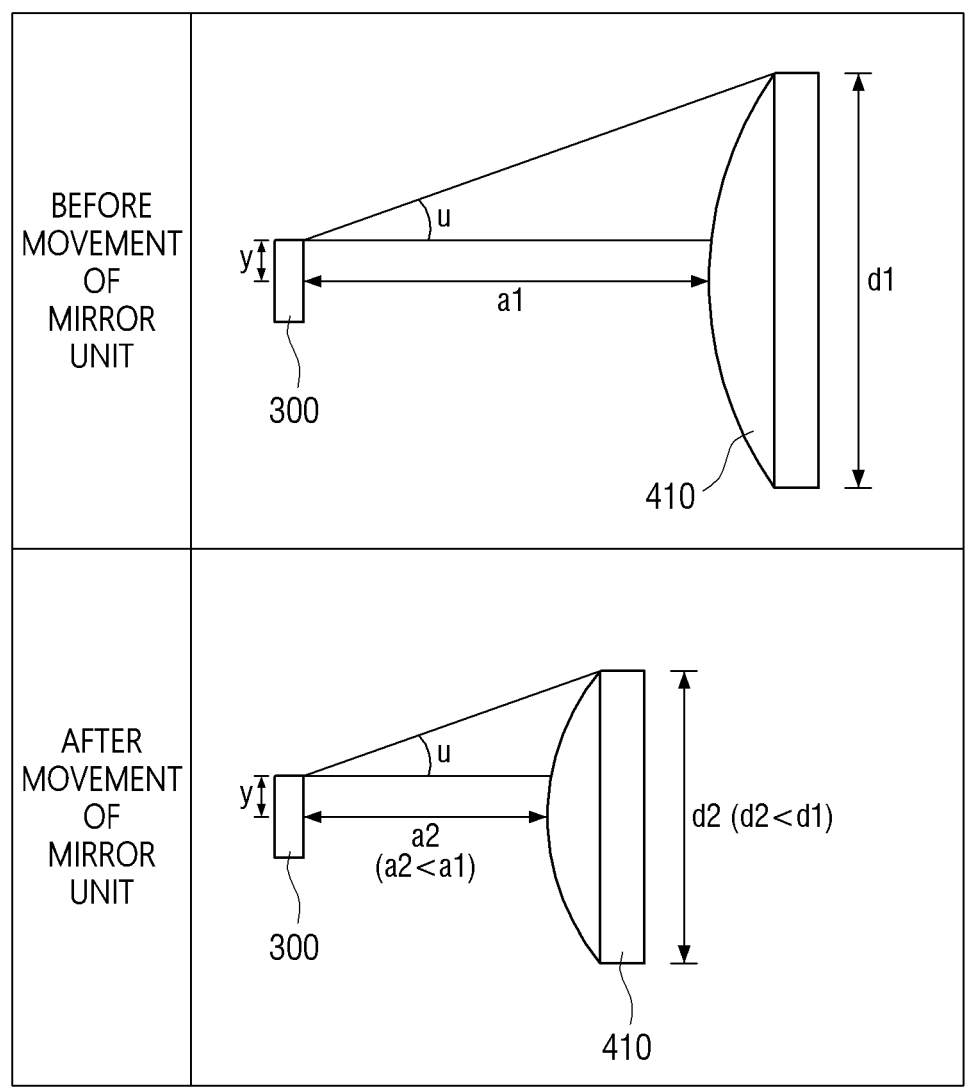
FIG. 6 is a schematic diagram illustrating the distance between the mirror unit and the imaging unit and the diameter of the lens depending on the position of the mirror unit according to an exemplary embodiment of the present disclosure.

In other words, referring to FIG. 6, without the movement of the mirror unit 300, i.e., when the center C of the reflecting surface 310 of the mirror unit 300 is disposed on the optical axis Ax of the imaging unit 400 parallel to the horizontal line HL that passes through the center of the incident portion 400a of the imaging unit 400, the imaging unit 400 is disposed in front of the light control unit 200 to prevent the structural interference with the light source unit 100 and the light control unit 200. Therefore, the distance between the mirror unit 300 and the first lens 410 may be set to a1. On the other hand, in the exemplary embodiment of the present disclosure, the center C of the reflecting surface 310 of the mirror unit 300 may be disposed below the horizontal line HL that passes through the center of the incident portion 400a of the imaging unit 400. Therefore, the optical axis Ax of the imaging unit 400 may be inclined at a predetermined angle to the horizontal line HL as described above. Accordingly, the length of the first lens 410 in the vertical direction may be reduced, thus enabling the first lens 410 to be disposed closer toward the mirror unit 300. Consequently, the distance between the mirror unit 300 and the first lens 410 may be set to a2 which is smaller than a1.

In addition, due to the position of the mirror unit 300, since the distance between the mirror unit 300 and the first lens 410 becomes a2 that is smaller than a1, the diameter of the first lens 410 may become d2 that is smaller than d1 which is a diameter of the first lens 410 without the movement of the mirror unit 300. Consequently, the length of the lighting device 1 of the present disclosure in a horizontal direction may be reduced, resulting in a reduction in the overall size of the lighting device 1.

In the exemplary embodiment of the present disclosure, the light source unit 100 may be disposed on the upper side of the mirror unit 300, and the light control unit 200 may be disposed on the lower side of the mirror unit 300. Due to the mirror unit 300 disposed below the horizontal line HL that passes through the center of the incident portion 400a of the imaging unit 400 as described above, the light source unit 100 may be disposed relatively closer to the light control unit 200. Therefore, the length of the lighting device 1 of the present disclosure in the vertical direction may be reduced, resulting in a reduction in the overall size of the lighting device 1.

Figure 7:
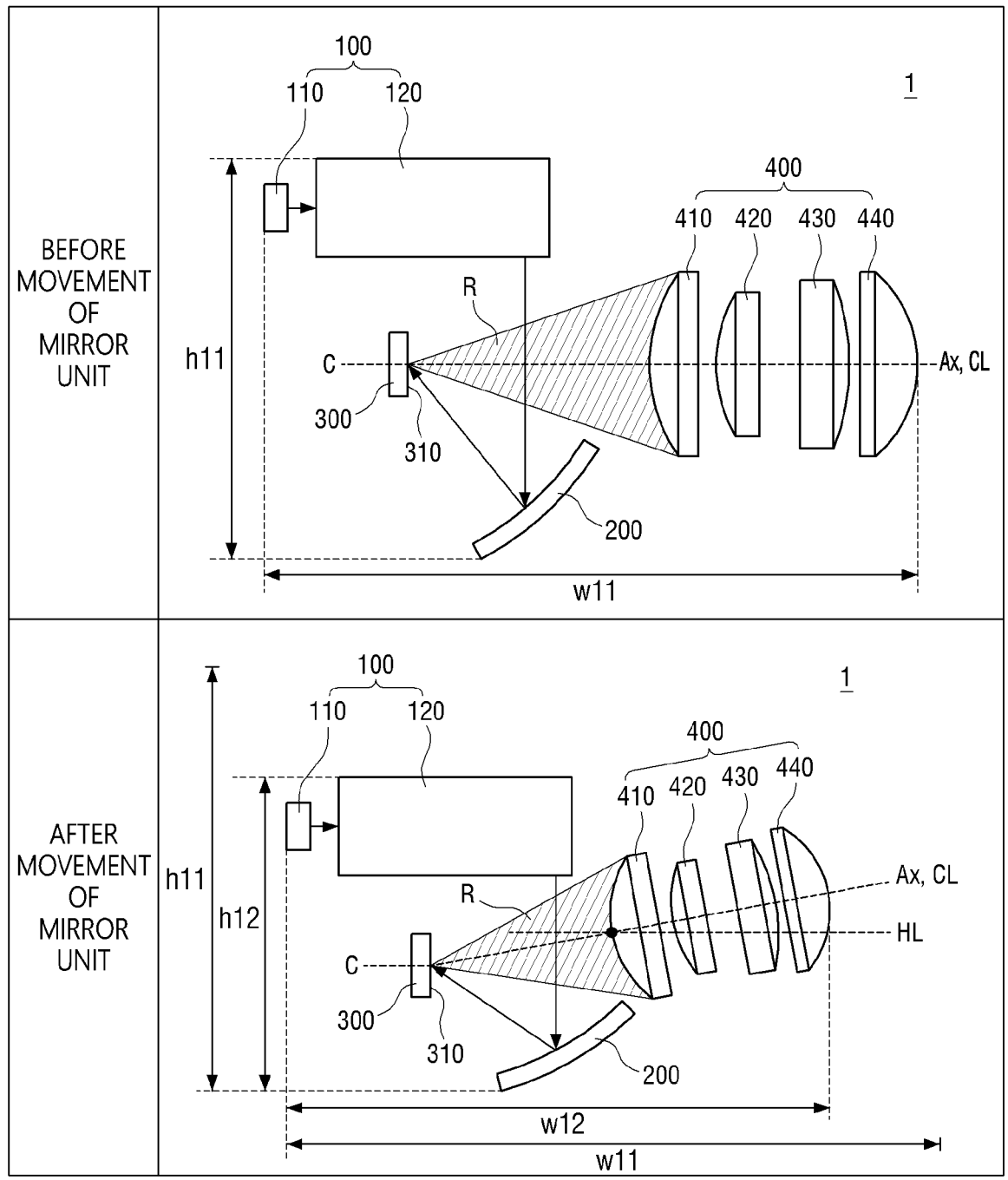
FIG. 7 is a schematic diagram illustrating the size of the lighting device depending on the position of the mirror unit according to an exemplary embodiment of the present disclosure.

In other words, referring to FIG. 7, without the movement of the mirror unit 300, i.e., when the optical axis Ax of the imaging unit 400 is parallel to the horizontal line HL that passes through the center of the incident portion 400a of the imaging unit 400 and the center C of the mirror unit 300 is disposed on the optical axis Ax of the imaging unit 400, the imaging unit 400, i.e., the first lens 410 is disposed in front of the light control unit 200 at a predetermined distance from the light control unit 200 in order to prevent the structural interference between the light control unit 200 and the imaging unit 400 and the structural interference between the light source unit 100 and the imaging unit 400. Therefore, the lighting device 1 has a length of w11 in the horizontal direction and a length of h11 in the vertical direction.

On the other hand, in the exemplary embodiment of the present disclosure, due to the movement of the mirror unit 300, i.e., when the center C of the mirror unit 300 is disposed below the horizontal line HL that passes through the center of the incident portion 400a of the imaging unit 400 and when the optical Ax of the imaging unit 300 is inclined with respect to the horizontal line HL that passes through the center of the incident portion 400a of the imaging unit 400, the distance between the mirror unit 300 and the imaging unit 400, i.e., the first lens 410 may be relatively reduced to reduce the diameter of the first lens 410, and the light source unit 100 and the light control unit 200 may be disposed relatively closer to each other. Therefore, the lighting device 1 may have a length of w12 which is smaller than w11 in the horizontal direction and a length of h12 which is smaller than h11 in the vertical direction. Consequently, the overall size of the lighting device 1 may be reduced.

In the exemplary embodiment of the present disclosure, a line that perpendicularly passes through the reflecting surface 310 of the mirror unit 300 may be disposed parallel to the horizontal line HL that passes through the center of the incident portion 400a of the imaging unit 400. Alternatively, the line that perpendicularly passes through the reflecting surface 310 of the mirror unit 300 may also be inclined at a predetermined angle with respect to the horizontal line HL that passes through the center of the incident portion 400a of the imaging unit 400 depending on the irradiation range R of the light reflected by the mirror unit 300.

In addition, in the exemplary embodiment of the present disclosure, a case where the optical axis Ax of the imaging unit 400 passes through the center C of the reflecting surface 310 of the mirror unit 300 is described as an example. However, the optical axis Ax of the imaging unit 400 may also pass above or below the center C of the reflecting surface 310 of the mirror unit 300 depending on the irradiation range R of the light reflected by the mirror unit 300.

As described above, in the lighting device 1 of the present disclosure, the mirror unit 300 may be moved downward, and the centerline CL of the light irradiation range R of the mirror unit 300 may be inclined upward from the horizontal line HL, which passes through the center of the incident portion 400a of the imaging unit 400, toward the front. Therefore, the distance between the mirror unit 300 and the imaging unit 400, i.e., the distance between the mirror unit 300 and the first lens 410 may be reduced to reduce the diameter of the first lens 410 as compared with when the centerline CL of the irradiation range R of the light reflected by the mirror unit 300 coincides with the optical axis Ax of the imaging unit 400 and the optical axis Ax of the imaging unit 400 is disposed parallel to the horizontal line HL that passes through the center of the incident portion 400a of the imaging unit 400. In addition, as the mirror unit 300 is moved downward, the distance between the light source unit 100 and the light control unit 200 disposed opposite each other may be reduced. Therefore, the overall size of the lighting device 1 of the present disclosure may be reduced.

In the above-described exemplary embodiment, the light source unit 100 and the light control unit 200 may be disposed on opposite sides of the mirror unit 300, for example, on the upper and lower sides of the mirror unit 300, respectively. Alternatively, the light source unit 100 and the light control unit 200 may also be disposed on the same side of the mirror unit 300.

Figure 8:
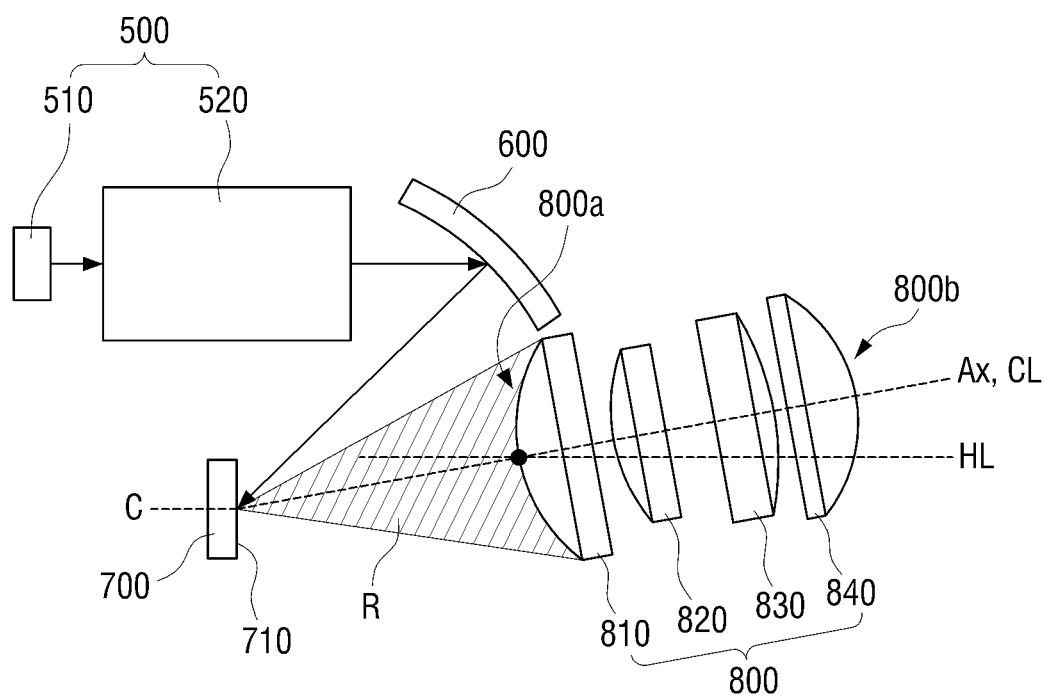
FIG. 8 is a schematic diagram of a lighting device according to an exemplary embodiment of the present disclosure.

FIG. 8 is a schematic diagram of a lighting device 1 according to an exemplary embodiment of the present disclosure. Referring to FIG. 8, the lighting device 1 according to the exemplary embodiment of the present disclosure may include a light source unit 500, a light control unit 600, a mirror unit 700, and an imaging unit 800 as in the above-described exemplary embodiment. The light source unit 500, the light control unit 600, the mirror unit 700 and the imaging unit 800 of the exemplary embodiment of the present disclosure may serve the same functions as the light source unit 100, the light control unit 200, the mirror unit 300 and the imaging unit 800 of the above-described exemplary embodiment, respectively. The same terminology will be used for elements having the same function, and a detailed description of the elements will be omitted.

In the exemplary embodiment of the present disclosure, the light source unit 500 and the light control unit 600 may be disposed on an upper side of the mirror unit 700. Alternatively, the light source unit 500 and the light control unit 600 may also be disposed on the same side of the mirror unit 700.

Even when the light source unit 500 and the light control unit 600 are disposed on the same side of the mirror unit 700, a center C of a reflecting surface 710 of the mirror unit 700 may be disposed above or below a horizontal line HL that passes through a center of an incident portion 800a of the imaging unit 800. Herein, the horizontal line HL may be defined as a line that is parallel to the light generated by the light source 510 and/or parallel to the light that is transmitted from the light transmitting unit 520 (i.e., the light that is transmitted from the light source unit 500). This configuration may prevent the structural interference between the light source unit 500, the light control unit 600 and the imaging unit 800 and may reduce the distance between the mirror unit 700 and the imaging unit 800 as in the above-described exemplary embodiment, thereby reducing the overall size of the lighting device 1 of the present disclosure.

Figure 9:
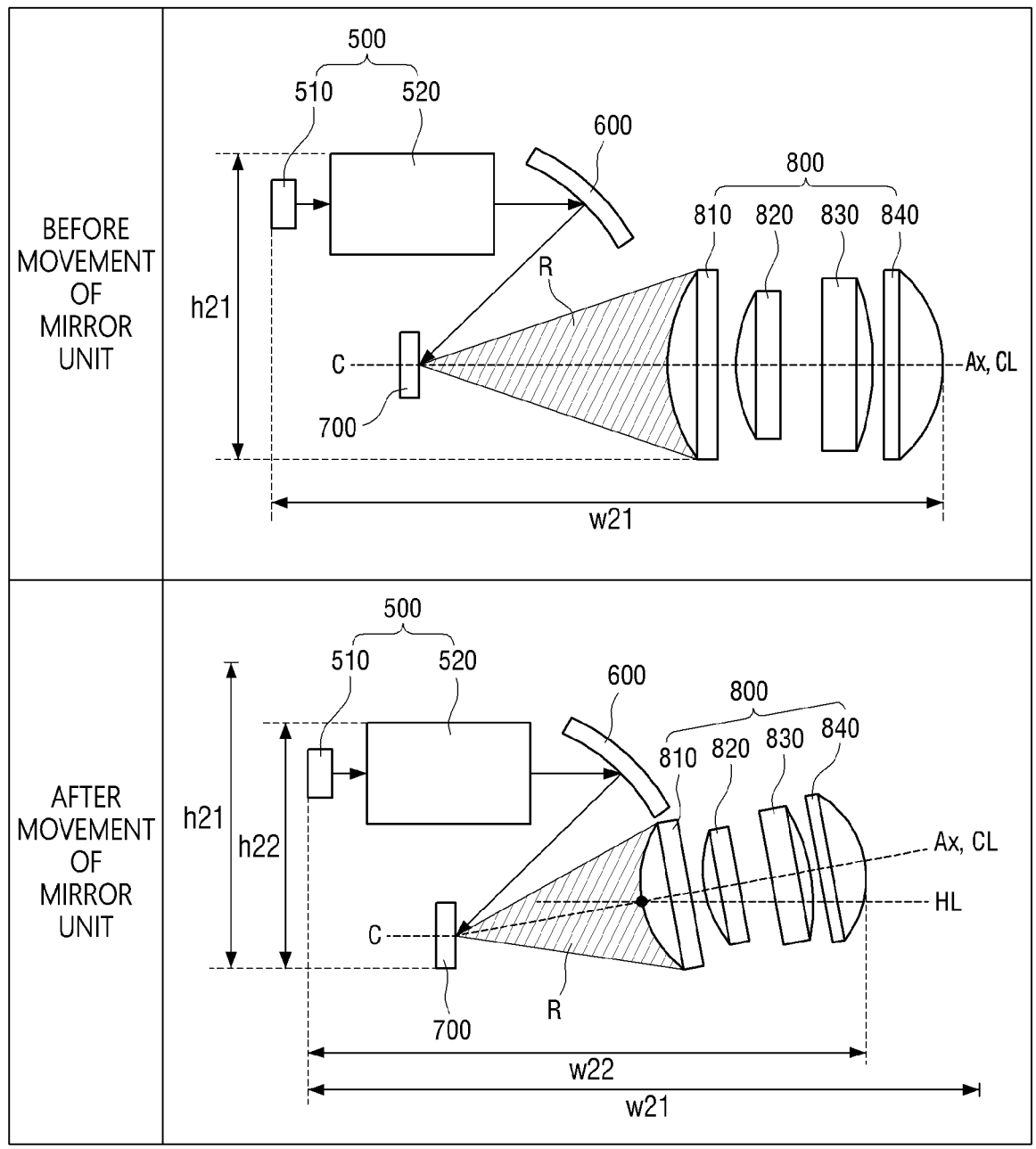
FIG. 9 is a schematic diagram illustrating the size of the lighting device of FIG. 8 depending on the position of a mirror unit according to an exemplary embodiment of the present disclosure.

For example, as illustrated in FIG. 9, when the center C of the mirror unit 700 is disposed below the horizontal line HL that passes through the center of the incident portion 800a of the imaging unit 800 as illustrated in FIG. 8, the lighting device 1 may have a length of w22 in the horizontal direction and a length of h22 in the vertical direction which are smaller than w21 and h21 when the center C of the mirror unit 700 and an optical axis Ax of the imaging unit 800 are disposed parallel to the horizontal line HL that passes through the center of the incident portion 800a of the imaging unit 800. Therefore, the overall size of the lighting device 1 may be reduced.

A lighting device according to the present disclosure may provide at least one of the following advantages.

Since the distance between a mirror unit and an imaging unit is reduced due to a position of the mirror unit with respect to the imaging unit on which light reflected by the mirror unit is incident, the size of the imaging unit may be reduced. Therefore, the overall size of the lighting device may be reduced, while deterioration of light efficiency is prevented.

However, the effects of the exemplary embodiments are not restricted to the one set forth herein. The above and other effects of the exemplary embodiments will become more apparent to one of daily skill in the art to which the exemplary embodiments pertain by referencing the claims.

While the present disclosure has been particularly shown and described with reference to exemplary embodiments thereof, it will be understood by those of ordinary skill in the art that various changes in form and detail may be made therein without departing from the spirit and scope of the present disclosure as defined by the following claims. The exemplary embodiments should be considered in a descriptive sense only and not for purposes of limitation. The scope of the present disclosure is defined by the following claims, rather than by the above-described detailed description. The meanings and scope of the claims, and all modifications or modified shapes, which are derived from equivalent concepts thereof, should be understood as being included in the scope of the present disclosure.

What is claimed is:

1. A lighting device comprising:
a light source unit;
an imaging unit which transmits incident light to form a predetermined optical pattern;
a mirror unit which is disposed behind the imaging unit and reflects light to the imaging unit; and
a light control unit which reflects light generated from the light source unit to the mirror unit at a predetermined angle and pattern,
wherein the imaging unit comprises a plurality of lenses having the same optical axis and arranged along the optical axis and emits the light to outside of the lighting device.

2. The lighting device of claim 1, wherein a center of the mirror unit is disposed above or below a horizontal line that passes through a center of an incident portion of the imaging unit.

3. The lighting device of claim 2, wherein the center of the incident portion is a center of an incident surface of a lens disposed closest to the mirror unit among the plurality of lenses.

4. The lighting device of claim 2, wherein the optical axis of the imaging unit is inclined at a predetermined angle with respect to the horizontal line.

5. The lighting device of claim 2, wherein the optical axis of the imaging unit is inclined upward or downward from the horizontal line toward the front.

6. The lighting device of claim 2, wherein a centerline of an irradiation range of light reflected by the mirror unit is inclined at a predetermined angle with respect to the horizontal line.

7. The lighting device of claim 6, wherein the centerline of the irradiation range of the light reflected by the mirror unit coincides with the optical axis of the imaging unit.

8. The lighting device of claim 2, wherein the centerline of the irradiation range of the light reflected by the mirror unit is inclined upward or downward from the horizontal line toward the front.

9. The lighting device of claim 2, wherein a line that perpendicularly passes through a reflecting surface of the mirror unit is disposed parallel to the horizontal line.

10. The lighting device of claim 2, wherein a line that perpendicularly passes through the reflecting surface of the mirror unit is inclined at a predetermined angle with respect to the horizontal line.

11. The lighting device of claim 1, wherein the light source unit is disposed on one of an upper side and a lower side with respect to a path of light reflected by the mirror unit, and the light control unit is disposed on the other of the upper side and the lower side.

12. The lighting device of claim 1, wherein the light source unit and the light control unit are disposed on the same side with respect to a path of light reflected by the mirror unit.

13. The lighting device of claim 1, wherein the light source unit comprises a reflector which reflects light generated from a light source to the light control unit, and
wherein the mirror unit and the imaging unit are disposed between the reflector and the light control unit to allow light reflected by the mirror unit to be incident on the imaging unit.

14. The lighting device of claim 1, wherein the optical axis of the plurality of lenses passes above or below the center of the mirror unit.

15. The lighting device of claim 1, wherein the mirror unit comprises a plurality of micromirrors.

16. The lighting device of claim 15, wherein the mirror unit further comprises actuators to adjust an angle of each of the plurality of micromirrors.

* * * * *